United States Patent
Reinicker et al.

(10) Patent No.: US 11,098,402 B2
(45) Date of Patent: *Aug. 24, 2021

(54) STORAGE AND DELIVERY OF ANTIMONY-CONTAINING MATERIALS TO AN ION IMPLANTER

(71) Applicants: Aaron Reinicker, Cary, NC (US); Ashwini K Sinha, East Amherst, NY (US); Douglas C. Heiderman, Akron, NY (US)

(72) Inventors: Aaron Reinicker, Cary, NC (US); Ashwini K Sinha, East Amherst, NY (US); Douglas C. Heiderman, Akron, NY (US)

(73) Assignee: Praxair Technology, Inc., Danbury, CT (US)

(*) Notice: Subject to any disclaimer, the term of this patent is extended or adjusted under 35 U.S.C. 154(b) by 22 days.

This patent is subject to a terminal disclaimer.

(21) Appl. No.: 16/871,605

(22) Filed: May 11, 2020

(65) Prior Publication Data
US 2020/0340098 A1 Oct. 29, 2020

Related U.S. Application Data

(63) Continuation-in-part of application No. 16/283,027, filed on Feb. 22, 2019, now Pat. No. 10,711,343.
(Continued)

(51) Int. Cl.
*C23C 14/48* (2006.01)
*B65D 83/14* (2006.01)
(Continued)

(52) U.S. Cl.
CPC .............. *C23C 14/14* (2013.01); *B01B 1/005* (2013.01); *C23C 14/48* (2013.01); *H01L 21/265* (2013.01)

(58) Field of Classification Search
CPC .................................. B65D 5/40; B65D 83/14
See application file for complete search history.

(56) References Cited

U.S. PATENT DOCUMENTS

| 4,588,609 A | 5/1986 | Leyden et al. |
| 5,518,528 A | 5/1996 | Tom et al. |
| (Continued) | | |

FOREIGN PATENT DOCUMENTS

| CN | 1076634 C | 12/2001 |
| CN | 103728157 A | 4/2014 |
| (Continued) | | |

OTHER PUBLICATIONS

G.M. Oleszek et al., Sb Implantation for Bipolar Buried Layers Using SbF5, in a Cold-Cathode Implantation System, Nuclear Instruments and Methods in Physics Research B6 (1985) pp. 389-393, North-Holland, Amsterdam, 0168-583X/85/$03.30 Elsevier Science Publishers B.V. (North-Holland Physics Publishing Division).

(Continued)

*Primary Examiner* — Jae Lee
(74) *Attorney, Agent, or Firm* — Nilay S. Dalal

(57) ABSTRACT

A novel method, composition and storage and delivery container for using antimony-containing dopant materials are provided. The composition is selected with sufficient vapor pressure to flow at a steady, sufficient and sustained flow rate into an arc chamber as part of an ion implant process. The antimony-containing material is represented by a non-carbon containing chemical formula, thereby reducing or eliminating the introduction of carbon-based deposits into the ion chamber. The composition is stored in a storage and delivery vessel under stable conditions, which includes a moisture-free environment that does not contain trace amounts of moisture. The storage and delivery container is specifically designed to allow delivery of high purity, vapor (Continued)

phase antimony-containing dopant material at a steady, sufficient and sustained flow rate.

13 Claims, 4 Drawing Sheets

Related U.S. Application Data which is a continuation-in-part of application No. 16/106,197, filed on Aug. 21, 2018, now Pat. No. 10,597,773.

(60) Provisional application No. 62/548,688, filed on Aug. 22, 2017.

(51) Int. Cl.
    *B65D 5/40* (2006.01)
    *C23C 14/14* (2006.01)
    *B01B 1/00* (2006.01)
    *H01L 21/265* (2006.01)

(56) References Cited

U.S. PATENT DOCUMENTS

| | | |
|---|---|---|
| 5,937,895 A | 8/1999 | Le Febre et al. |
| 6,005,127 A | 12/1999 | Todd et al. |
| 6,007,609 A | 12/1999 | Semerdjian et al. |
| 6,045,115 A | 4/2000 | Martin, Jr. et al. |
| 6,204,180 B1 | 3/2001 | Tom et al. |
| 6,319,565 B1 | 11/2001 | Todd et al. |
| 7,708,028 B2 | 5/2010 | Brown et al. |
| 7,905,247 B2 | 3/2011 | Campeau |
| 9,165,773 B2 | 10/2015 | Sinha et al. |
| 9,257,286 B2 | 2/2016 | Heiderman et al. |
| 2004/0206241 A1* | 10/2004 | Tempel ............ F17C 11/00 96/155 |
| 2005/0051096 A1 | 3/2005 | Horsky et al. |
| 2006/0011064 A1 | 1/2006 | Carruthers |
| 2006/0060817 A1* | 3/2006 | Tempel ............ C01B 3/001 252/181.3 |
| 2013/0253217 A1* | 9/2013 | Ishii ............ C07C 51/215 558/319 |
| 2013/0334516 A1 | 12/2013 | Weiss et al. |
| 2014/0084219 A1 | 3/2014 | Zhao et al. |
| 2014/0357069 A1 | 12/2014 | Sinha et al. |
| 2015/0056380 A1 | 2/2015 | Savas et al. |
| 2015/0228486 A1 | 8/2015 | Kaim et al. |
| 2016/0258537 A1 | 9/2016 | Heiderman et al. |
| 2016/0276155 A1 | 9/2016 | Cameron et al. |
| 2017/0121845 A1* | 5/2017 | Grutzmacher ...... H01L 21/0262 |
| 2017/0190723 A1* | 7/2017 | Reinicker ............ C09D 5/24 |
| 2017/0292186 A1* | 10/2017 | Reinicker ............ H01J 37/08 |

FOREIGN PATENT DOCUMENTS

| | | |
|---|---|---|
| EP | 3188214 A1 | 7/2017 |
| JP | S6240377 A | 2/1987 |
| JP | S6438700 A | 2/1989 |
| WO | 2005/093777 A2 | 10/2005 |
| WO | 2007/056249 A1 | 5/2007 |
| WO | 2016069516 A1 | 5/2016 |

OTHER PUBLICATIONS

Not Always Obvious to Optimize Claimed Variables; Oblon, Mar. 5, 2012—Blog Post; McClelland, Maier & Neustadt, L.L.P.—Intellectual Property Law Firm; https://www.oblon.com/news/not-always-obvious-to-optimize-claimed-variables.

* cited by examiner

Schematic of beamline ion implant system

Schematic of plasma immersion ion implant system

PACKAGE FOR Sb CONTAINING DOPANT MATERIALS

STORAGE AND DELIVERY OF ANTIMONY-CONTAINING MATERIALS TO AN ION IMPLANTER

RELATED APPLICATIONS

This application is a continuation in-part of U.S. application Ser. No. 16/283,027 filed on Feb. 22, 2019, which is a continuation-in-part of U.S. application Ser. No. 16/106,197 filed on Aug. 21, 2018, which claims the benefit of priority to U.S. provisional application Ser. No. 62/548,688 filed on Aug. 22, 2017, the disclosures of which are incorporated by reference herein in their respective entireties.

FIELD OF INVENTION

The present invention relates to a storage and delivery container for novel antimony-containing materials for ion implantation and suitable conditions for storage and delivery of the materials for ion implant processes.

BACKGROUND OF THE INVENTION

Ion implantation is a critical process in semiconductor/microelectronic manufacturing. The ion implantation process is typically used in integrated circuit fabrication to introduce dopant impurities into semiconductor wafers. Generally speaking, with respect to semiconductor applications, ion implantation involves the introduction of ions from a dopant gas, also commonly referred to as dopant impurities, into a semiconductor wafer to alter the physical, chemical and/or electrical characteristics of the wafer in a desired manner. The desired dopant impurities are introduced into semiconductor wafers in trace amounts to form doped regions at a desired depth into the surface of the wafer. The dopant impurities are selected to bond with the semiconductor wafer to create electrical carriers and thereby alter the electrical conductivity of the semiconductor wafer. The concentration or dosage of dopant impurities introduced into the wafer determines the electrical conductivity of the doped region. In this manner, several impurity regions are created to form transistor structures, isolation structures and other electronic structures, which collectively function as a semiconductor device.

An ion source is used to generate an ion beam of ion species from a source dopant gas. The ion source is a critical component of the ion implantation system, which serves to ionize the dopant gas to produce certain dopant ions that are to be implanted during the implantation process. The ion source chamber comprises a cathode, such as a filament made of tungsten (W) or a tungsten alloy, which is heated to its thermionic generation temperature to generate electrons. The electrons accelerate towards the arc chamber wall and collide with the dopant source gas molecule in the arc chamber to generate a plasma. The plasma comprises dissociated ions, radicals, and neutral atoms and molecules of the dopant gas species. The ion species are extracted from the arc chamber and then separated from the other ionic species based on mass. Only ions in the beam based on a certain mass-to-charge ratio can pass through a filter. The selected mass of ions contains the desired ion species which is then directed towards the target substrate and implanted into the target substrate at the required depth and dosage.

Current semiconductor device technology utilizes a variety of dopant species in specific amounts to produce p-type and n-type semiconductors, both of which are considered building blocks for the manufacture of transistor and diode electronic devices. The difference in p-type and n-type dopants is primarily related to the charge carrying species introduced into the semiconductor crystal lattice. A p-type dopant is used to generate electron "holes" in the semiconductor material by creating electron deficiencies in the valence band while n-type dopants are used to generate free electrons in a semiconductor material. Antimony (Sb) is an example of a commonly used dopant species required for today's electronic devices. Sb is an n-type dopant with many desirable uses that continues to gain interest in the semiconductor industry. For example, Indium Antimonide is a narrow bandgap III-V semiconductor used as an infrared detector. Antimony is also used to form ultra-shallow p-n junctions in finFET devices; threshold voltage tuning of channels in MOSFETs; punch through stop halo implants in pMOS device; and source-drain regions in germanium n-MOSFETs.

Currently, solid sources of Sb are used as dopant materials. Elemental Sb metal can be used for ion implantation by placing it in close proximity to a filament. During ion implantation, the temperature of the filament is sufficiently high such that radiative heating causes Sb to evaporate and collide with electrons to create Sb-containing ions for doping. However, this method can cause Sb to deposit on the chamber walls or on the filament, shortening the filament lifetime. Solid compounds of Sb are also used as dopant sources, such as $SbF_3$, $SbCl_3$, and $Sb_2O_3$, but these compounds require heating to above 160° C. to generate a sufficient amount of vapor necessary for ion implantation. Additionally, all flow lines in the system are typically heated to prevent re-condensation of the solid sources of Sb before reaching the arc chamber.

Given the operational challenges of solid sources of Sb for implanting Sb-containing ions, gas sources of Sb have been contemplated. In particular, $SbH_3$ and $SbD_3$ have been proposed as gaseous sources of Sb, but these compounds are unstable and decompose at room temperature.

For these reasons, there is currently an unmet need for a suitable storage and delivery container for antimony-containing materials that can deliver antimony containing dopant composition for ion implantation in a controlled manner.

SUMMARY OF THE INVENTION

The invention may include any of the following aspects in various combinations and may also include any other aspect described below in the written description or in the attached drawings.

The invention relates to a storage and delivery system for using antimony dopant compositions. The storage and delivery system disclosed herein have been found to improve ease of delivery to an ion implant process and substantially reduce accumulation of Sb-containing deposits within the ion chamber In a first aspect, a sub-atmospheric storage and delivery vessel configured for delivering a high purity, vapor phase of antimony-containing material, comprising: a storage and delivery vessel, said storage and delivery vessel configured for holding said antimony-containing material in a liquid phase under sub-atmospheric conditions, whereby said liquid phase is in substantial equilibrium with the high purity, vapor phase of the antimony-containing material, and said high purity, vapor phase of the antimony-containing material exerting a vapor pressure less than atmospheric pressure, said high purity, vapor phase equal to about 95 vol % or greater based on a total volume of the vapor phase; said storage and delivery vessel comprising multiple walls having sufficient surface area contact with the liquid phase, and further wherein said multiple walls exhibit a thermally conductivity to enhance heat conduction into the liquid; said storage and delivery vessel characterized by an absence of external heating and an absence of a carrier gas during dispensing of the high purity, vapor phase antimony-containing material.

In a second aspect, a sub-atmospheric storage and delivery vessel configured for delivering a high purity, vapor phase of antimony-containing material, comprising: a storage and delivery vessel, said storage and delivery vessel configured for holding said antimony-containing material in a liquid phase under sub-atmospheric conditions, whereby said liquid phase is in substantial equilibrium with the high purity, vapor phase of the antimony-containing material occupying a predetermined volume of headspace in the storage and delivery vessel, and said high purity, vapor phase of the antimony-containing material exerting a vapor pressure less than atmospheric pressure, said high purity, vapor phase equal to about 95 vol % or greater based on the predetermined volume of the headspace; said predetermined volume of the headspace being sized so as to receive a sufficient amount of the high purity, vapor phase of the antimony-containing material; said storage and delivery vessel characterized by an absence of external heating and an absence of a carrier gas during dispensing of the high purity, vapor phase antimony-containing material.

In a third aspect, a high purity antimony containing material in a storage vessel comprising a liquid phase and a vapor phase, said vapor phase comprising a total amount of vapor phase impurities ranging from 0 to 5 vol % impurities wherein the vapor phase impurities comprises 0 to 4 vol % N2, 0 to 0.5 vol % O2, 0 to 0.49 vol % HF; 0 to 0.01 vol % $H_2O$; and the balance being the antimony-containing material in the vapor phase.

In a fourth aspect, a high purity antimony-containing material in a storage vessel comprising a liquid phase and a vapor phase, said liquid phase comprising a total amount of liquid phase impurities ranging from 0 to 1 vol % impurities, wherein the liquid phase impurities comprises 0 to 0.1 vol % N2, 0 to 0.1 vol % O2, 0 to 0.6 vol % HF, 0 to 0.1 vol % $SbF_3$, 0 to 0.1 vol % $Sb_2O_3$ and the balance being the antimony-containing material in the liquid phase.

In a fifth aspect, a method of preparing a sub-atmospheric storage and delivery vessel configured for delivery of a steady, sustained and sufficient flow of a high purity, vapor phase of antimony source material, comprising the steps of: providing a container with multiple walls having a thermal conductivity of 5 W/m*K; performing a fluorine passivation to the multiple walls, followed by; introducing an antimony-containing material in a liquid phase into the container in a presence of an inert gas; creating a predetermined headspace volume of greater than or equal to about 1 L, said predetermined headspace volume having trace amounts of impurities; evaporating a sufficient amount of the antimony containing material into the vapor phase in the predetermined headspace volume, wherein said step of evaporating is performed with an absence of external heating; freezing the liquid phase of the antimony containing material to form frozen antimony containing material; condensing the vapor phase of the antimony containing material from the predetermined headspace volume to form a condensed high purity, vapor phase; evacuating nitrogen, water vapor, the inert gas and any other gaseous impurities from the predetermined headspace volume; allowing the condensed vapor phase to increase in temperature so as to form the high purity, vapor phase within the predetermined headspace volume; and allowing the frozen antimony containing material to increase in temperature to re-form the liquid phase.

In a sixth aspect, a method of using a sub-atmospheric storage and delivery vessel filled with high purity antimony-containing material, comprising: operably connecting the vessel to a downstream ion implant tool; establishing a pressure downstream of the sub-atmospheric storage and delivery vessel that is less than the vapor pressure of a high purity, vapor phase of the antimony-containing material occupying a predetermined headspace volume of the vessel; actuating a valve into the open position; dispensing the antimony-containing material from the predetermined headspace volume of the vessel in an absence of heating, said antimony-containing material dispensed as a high purity, vapor phase at a flowrate of 0.1 sccm or greater in an absence of a carrier gas; and flowing the high purity, vapor phase of the antimony-containing material in an absence of the carrier gas at the flowrate of 0.1 sccm or greater towards the ion implant tool; and evaporating additional antimony-containing material from a corresponding liquid phase in the vessel in the absence of heating to continue supplying the high purity, vapor phase of the antimony-containing material from the headspace at the flowrate of 0.1 sccm or greater.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

Figure 1:
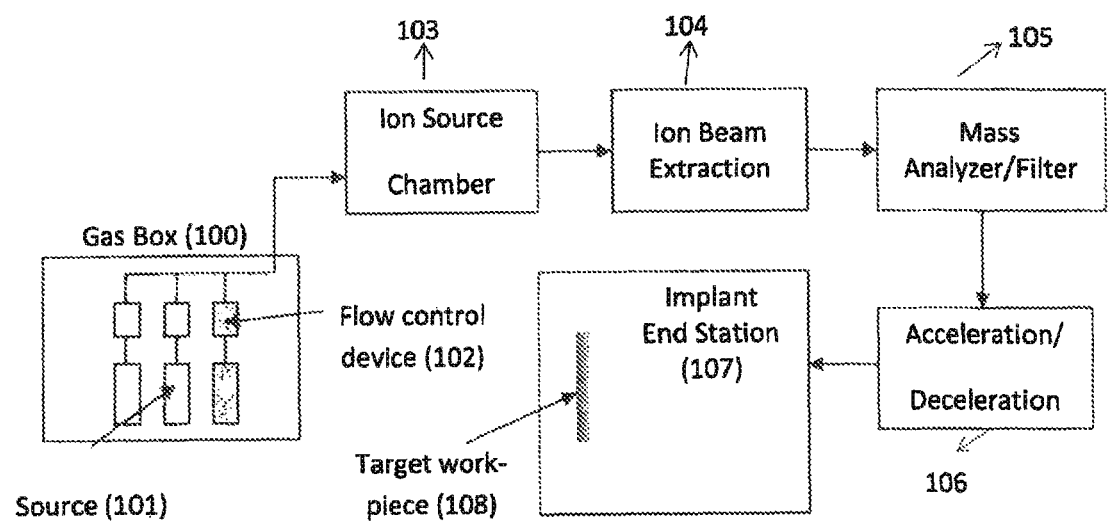
FIG. 1 shows a beamline ion implant system, incorporating the principles of the invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

The invention may include any of the following embodiments in various combinations and may also include any other aspect described below in the written description or in the attached drawings. As used herein, the term "embodiment" means an embodiment that serves to illustrate by way of example but not limitation.

As used herein and throughout, the term "Sb-containing ions" or "Sb ions" means various Sb ionic species, including Sb ions or Sb-containing ions such as $Sb^+$ or $Sb^{2+}$ and oligomer ions, such as, but not limited to, $Sb_2^+$ suitable for implantation into a substrate.

"Substrate" as used herein and throughout refers to any material, including, but not limited to, a wafer or other sliced or non-sliced material or similar target object requiring ion implantation, formed from any suitable material including, silicon, silicon dioxide, germanium, gallium arsenide and alloys thereof, into which another material, such as a dopant ion, is implanted.

It should be understood that "Sb" and "antimony" will be used interchangeably herein and throughout and are intended to have the same meaning. Reference to "Sb-containing material" or "Sb-containing source material" or "Sb source material" is intended to refer to a liquid phase of the inventive antimony material as well as the corresponding vapor phase with which the liquid phase is in substantial equilibrium. "Sb-containing liquid source material" is intended to mean the inventive material that is in substantial equilibrium with a corresponding vapor phase.

As used and throughout, the term "vessel" and "container" are used interchangeably and are intended to mean any type of storage, filling, transport and/or delivery vessel, including but not limited to, cylinders, dewars, bottles, tanks, barrels, bulk and microbulk, which are suitable for filling, storing, transporting, and/or delivery of materials. Consistent with such usage, the terms "storage and delivery vessel" and "storage and delivery container" will be used interchangably herein and throughout and is intended to mean a specifically designed vessel or container of the present invention that is a suitable supply source for holding antimony-containing material in a manner whereby additional antimony containing material in the liquid phase in the vessel or the container is able evaporate into a predetermined headspace volume at a rate of delivery that is equal to or greater than the flowrate of the vapor phase being dispensed.

"Reduce", "reduced" or "reduction" as used herein and throughout is made in reference to an ion implant process and is intended to mean (i) shorten, suppress and/or delay the onset of a detrimental event or occurrence (e.g., reduced decomposition reactions; reduced ion shorting); or (ii) lowered in amount to unacceptable levels which are incapable of achieving a specific purpose (e.g., reduced flow incapable of sustaining plasma); or (iii) lowered to an insubstantial amount which does not negatively impact a specific purpose (e.g., reduced amount of oligomers which does not destabilize flow into arc chamber); or (iv) reduced by a significant amount in comparison to conventional practice but which does not alter the intended function (e.g., reduced heat tracing while still maintaining a vapor phase of material without re-condensation of said material along conduit).

As used herein and throughout, "about" or "approximately" when referring to a measurable value such as an amount or a temporal duration is meant to encompass variations of ±20%, ±10%, ±5%, ±1% and ±0.1% from the specified value, as such variations are appropriate.

"High purity" as used herein and throughout means 95 vol % or greater purity.

"Ambient conditions" as used herein and throughout means the conditions of the environment, including ambient temperature and ambient pressure, that is in direct contact with a storage and delivery container filled with Sb-containing material of the present invention.

"Trace amounts" as used herein and throughout means a concentration of impurities, preferably including water vapor, nitrogen and any other gaseous impurities, in the aggregate that is 5 vol % or less.

Throughout this disclosure, various aspects of the invention can be presented in range format. It should be understood that the description in range format is merely for convenience and brevity and should not be considered as a limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

It has been recognized to utilize antimony containing materials for ion implantation. In this regard, Kasley et al. discloses the use of $SbF_5$ as an antimony source by heating the $SbF_5$ container to 52° C. to generate sufficient vapor pressure of $SbF_5$ in the container for antimony implantation into silicon substrates. While Kasley et al. discloses a viable use of such approach on a small-scale laboratory set-up, the present invention recognizes the deficiencies of such approach when attempted to be scaled up for operational use. Specifically, in an operational setting, the $SbF_5$ vapors generated upon heating at higher temperatures (e.g., temperatures above ambient temperature) have a tendency to condense downstream along flow lines extending between the antimony container and ion implant tool, as the flow lines are typically maintained at ambient conditions. The $SbF_5$ vapor condenses along the flow lines prior to entering the ion implanter, and therefore a steady, sufficient and sustained vapor phase flow of $SbF_5$ cannot be achieved.

To overcome such deficiencies, the present invention recognizes that the user needs to maintain the entire flow lines between the antimony source container and ion implant tool at high temperatures. However, from an operational standpoint, the system design and operation become increasingly complex, with regards to the ion-implant system which requires heating equipment to be maintained at significantly high electric potentials (e.g., 10 kV-100 kV). Such high electric potential levels can pose safety risks, which are compounded by the presence of toxic, corrosive, and/or flammable materials inside of the flow lines in close proximity to the ion implant system and heating equipment.

In view of the lack of a suitable storage and delivery system for an Sb source material for ion implantation, the present invention has emerged. The present invention recognizes and takes into account the above limitations to offer unique solutions for the storage and delivery of antimony-containing materials for ion implantation applications as well as other applications that require a controlled and sustained flow of vapor Sb-containing material to a downstream process.

The present invention in one aspect relates to a storage and delivery container for antimony-containing material, suitable for ion implantation as a n-type dopant, comprising the following attributes: (i) an antimony containing material that can be stored in the liquid phase under sub-atmospheric conditions at ambient conditions in which the storage conditions are in an impurity free environment characterized by an absence of trace amounts of water vapor, nitrogen and any other gaseous impurities in the headspace of the container, defined herein as no greater than about 5 vol % based on the headspace volume; (ii) the antimony-containing material represented by a non-carbon containing chemical formula; (iii) the storage and delivery container having a head space predetermined volume containing the vapor phase of the antimony containing material in substantial equilibrium with the liquid phase wherein the head space predetermined volume is greater than 1 liter of volume; and (iv) the storage and delivery container walls made of material with thermal conductivity at ambient conditions greater than 5 W/m-K; and (v) the storage and delivery system maintained at ambient conditions during its use for an antimony implant process. The sub-atmospheric storage and delivery container is capable of providing a sustained and sufficient flow of a vapor phase antimony source material at a purity of 95 vol % or greater and at sustained, sufficient and steady flow rates as described herein. More preferably, the purity of the vapor phase of the antimony source material is 99% or greater. The storage and delivery container is configured to operate so that a rate of evaporation of the antimony containing material in the liquid phase can form the corresponding vapor phase in the predetermined headspace volume in the absence of external heating at a rate that is equal to or greater than a rate of withdrawal of the corresponding vapor phase from the predetermined headspace volume during dispensing of the corresponding vapor phase.

The Sb-containing source material has a liquid phase in substantial equilibrium with a corresponding vapor phase under storage conditions. The material remains stable at ambient temperatures and does not have a tendency to decompose during ion implant use. The Sb-containing material as a liquid has an adequate vapor pressure, which is defined herein as an amount of vapor that can sustain a flow rate of about 0.1-100 sccm into the arc chamber, preferably 0.3-10 sccm, more preferably 1-10 sccm, and most preferably 1-5 sccm. In particular, the flow rate of Sb-containing material in the vapor phase is adequate so as to generate and maintain a stable plasma during operation of the ion implanter. The stable plasma allows the implantation of Sb ions to occur at an arc voltage of about 50-150 V and an extraction voltage of about 1-300 keV across extraction electrodes, whereby a beam of Sb-containing ions is produced. The beam current of Sb-containing ions ranges from about 10 microamps to 100 mA, resulting in a Sb ion dosage into the substrate of about 1E11 to 1E16 atoms/cm2.

In one aspect, the Sb-containing source material of the present invention is stored in a vessel in the liquid phase in substantial equilibrium with the vapor phase, whereby the vapor phase is withdrawn at high purity from the vessel at ambient temperature with no external heating required to be applied to the vessel. Applicants have found that issues may arise if external heating is applied to the vessel. In particular, if external heating is applied to the vessel and not applied to the lines, valves, and/or mass flow controllers, then the Sb containing material can condense in the lines, valves, and/or mass flow controllers which are at a lower temperature than the vessel. This condensation can cause flow instability and lead to clogging of system components and eventually prevent the flow of Sb containing material. If external heating is applied to the vessel, then the applicants discovered that heating must be applied to all components exposed to the Sb containing material including the lines, valves, and mass flow controllers so that the temperature of the lines, valves, and mass flow controller are greater than or equal to the temperature of the vessel. However, this adds complications to the system design, especially in the ion-implant system since the heating equipment needs to be maintained at a significantly high electric potential (10 kV-100 kV), which poses safety risks. For this reason, the Sb-containing material should be able to sustain a steady and sufficient flow rate at ambient temperature without the use of external heating. In one example, the ambient temperature can range from 10 Celsius to 35 Celsius. The range of sustainable, sufficient, and steady flow at ambient temperature is 0.1-100 sccm, preferably 0.3-10 sccm, more preferably 1-10 sccm and most preferably 1-5 sccm.

In another aspect of the present invention, the Sb-containing source material of the present invention is stored in a vessel in the liquid phase which is in substantial equilibrium with its vapor phase, which occupies a head space of the vessel, with the headspace having a predetermined volume into which a sufficient amount of the liquid phase of the antimony-containing material can evaporate to form the corresponding vapor phase. The vapor phase of the Sb-containing source material can be withdrawn in the vapor space at high purity from the vessel and delivered along a conduit into the arc chamber of ion implanter at ambient temperature conditions. Advantageously, the storage vessel offers a vapor head space having a predetermined volume greater than 1 liter. The inner walls of the storage vessel have thermal conductivity at ambient conditions greater than 5 W/m-K and the inner walls are in adequate contact with the liquid. In this manner, a sufficient amount of Sb-containing source material evaporates into the vapor phase at ambient temperature to sustain a flow rate of about 0.1-100 sccm that flows into the arc chamber preferably 0.3-10 sccm, more preferably 1-10 sccm, and most preferably 1-5 sccm.

Applicants have discovered that maintaining an evaporation rate of the liquid Sb-containing source material to produce a vapor phase flow rate of at least about 0.1 sccm or greater along conduit and into the arc chamber is required. When the evaporation rate of the Sb-containing source liquid is or falls below a certain threshold such that the resultant flow rate of the Sb-containing source material in the vapor phase is or falls below about 0.1 sccm, the Sb-containing material in the vapor phase may be flowing along conduit and into the arc chamber at a faster rate than the rate of evaporation of the Sb-containing source material that is contained in the vessel. The flow into the arc chamber may not be sustainable, and eventually be reduced to unacceptably low levels or have a tendency to become erratic. Ultimately, in a worst case scenario, the flow may completely stop or be reduced to a degree where the ion beam becomes unstable and fails, such that the entire implantation process is required to be aborted.

In an alternative embodiment, and as one viable means to accelerate the rate of evaporation, the liquid source Sb-containing material may be stored in a storage and delivery vessel maintained under sub-atmospheric conditions to enable the liquid source material to evaporate at a relatively higher rate that is sufficient to form the required amount of source material into the vapor phase that is responsible for generating the required flow rate of about 0.1-100 sccm into the arc chamber, preferably 0.3-10 sccm, more preferably 1-10 sccm, and most preferably 1-5 sccm. Accordingly, the liquid source Sb-containing material evaporates at a sufficient rate into the vapor phase to replenish the vapor in the headspace of the storage and delivery vessel and along the conduit extending into the arc chamber, thereby creating and maintaining a vapor phase flow rate of the Sb-containing source material between about 0.1-100 sccm during operation of the ion implanter for Sb ion implantation, preferably 0.3-10 sccm, more preferably 1-10 sccm, and most preferably 1-5 sccm.

To enable the required storage conditions for evaporation to occur, the storage and delivery vessel is configured with sufficient head space volume into which a sufficient volume of vapor of the Sb containing source can reside to allow the requisite vapor phase flow into the conduit that extends to the arc chamber. The applicants discovered that the storage and delivery vessel is prepared and configured with a head space predetermined volume of greater than or equal to 0.5 L, preferably greater than or equal to 1 L, more preferably greater than or equal to 1.5 L and most preferably, greater than or equal to 1.8 L. Additionally, sufficient surface area of the Sb-containing liquid exposed to the vapor phase within the storage and delivery vessel and sufficient contact area of the liquid with the inner walls is preferable to allow for the requisite evaporation to replenish the head space of the storage and delivery vessel as the corresponding vapor phase of the Sb-containing material flows along the conduit to create a substantially stable and sustained flow of the Sb-containing vapor at a high purity therealong and into the arc chamber. Specifically, the surface area of liquid exposed to the vapor phase is preferably at least about 16 cm2, more preferably greater than or equal to about 50 cm2 and most preferably greater than about 100 cm2 in combination with the liquid contact areas as described herein. In another embodiment of the present invention, the storage and delivery vessel is prepared such that sufficient surface area of the Sb-containing liquid contacts the inner walls of the storage and delivery vessel to allow for the requisite evaporation of the Sb-containing liquid into the predetermined volume of headspace. The evaporation occurs so as to replenish the headspace of the storage and delivery vessel with antimony-containing vapor, as the Sb-containing vapor exits the headspace and flows along the conduit to create a substantially stable (i.e., steady and sustained) and sufficient flow of the Sb-containing vapor therealong and into the arc chamber during the ion implant process. Thermal energy must be added to the Sb-containing liquid to evaporate a given quantity of the Sb-containing liquid into a vapor. When this energy transfer for evaporation of a certain portion of the liquid occurs, there can be a localized decrease in the temperature of the remaining Sb-containing liquid in the storage and delivery container to a temperature lower than the ambient temperature. However, if there is sufficient contact between the inner walls of the storage and delivery container and the Sb-containing liquid within the storage and delivery container, heat can be transferred through conduction from the walls of the storage and delivery container exposed to the environment outside of the storage and delivery container at ambient temperature to the Sb-containing liquid. The result is that the Sb-containing liquid can be maintained at approximately the same ambient temperature as the temperature existing external of the cylinder. As an example, for a liquid volume of about 335 mL and a head space volume of about 1.865 L, the surface area of liquid exposed to the inner walls is at least about 110 cm2, preferably greater than or equal to about 260 cm2 and more preferably greater than or equal to about 530 cm2. As another example, for a liquid volume of about 112 mL and a head space volume of about 2.088 L, the surface area of liquid exposed to the inner walls is at least about 50 cm2, preferably greater than or equal to about 140 cm2 and more preferably greater than or equal to about 300 cm2. As another example, for a liquid volume of about 1 L and a head space volume of about 1.2 L, the surface area of liquid exposed to the walls is preferably at least about 300 cm2, preferably greater than or equal to about 600 cm2, more preferably greater than or equal to about 1000 cm2.

To further increase the surface area of the antimony-containing liquid that is in contact with the inner walls of the vessel, different packing materials may be added inside of the storage and delivery vessel. By way of example, metals of various shape including spheres, bricks, flakes, cylinders, saddles, rings, squares, mesh, and powder cam be utilized. The packing materials may at least be partially immersed in the liquid phase.

In addition to having adequate liquid contact surface area with the inner walls of the vessel, the storage and delivery vessel is preferably made from a material with a thermal conductivity sufficient to facilitate the conduction of heat into the Sb-containing liquid. in the storage and delivery container to be maintained at a constant temperature during the evaporation of liquid into the vapor phase and during flow of Sb containing material. As an example, the storage and delivery vessel may be made out of carbon steel (54 W/m*K at 293 K), stainless steel (12-45 W/m*K at 293 K), iron (80 W/m*K at 300 K), aluminum (273 W/m*K at 300 K), copper (398 W/m*K at 300 K), gold (315 W/m*K at 300 K) or silver (424 W/m*K at 300 K). Carbon and stainless steel thermal conductivities are obtained from the Engineering Toolbox web site and element values for thermal conductivity were taken from Perry's Handbook of Chemical Engineering. In a preferred embodiment, the thermal conductivity of the walls of the storage and delivery vessel are greater than or equal to the thermal conductivity of the Sb-containing material. In another embodiment, the thermal conductivity of the walls of the storage and delivery vessel are greater than or equal to 1 W/m*K, preferably greater than 5 W/m*K, more preferably greater than or equal to 10 W/m*K and most preferably greater than or equal to 16 W/m*K.

Other storage conditions for the Sb-containing source material may cause the evaporation rate of the liquid source material to be unacceptably low. For example, if the Sb-containing liquid source material is stored in a storage and delivery vessel at a pressure equal to or greater than atmospheric pressure, then the partial pressure of the a vapor phase of the Sb-containing liquid source material may be insufficient, as a result of air, $N_2$, or any other inert and/or reactive gas species that may have been inadvertently introduced into the head space of the storage and delivery vessel upon a filling operation. Additionally, in such a scenario, the contamination of the Sb-containing material in the vapor phase with other contaminants can render the material unsuitable for usage in the ion implantation process, which generally cannot tolerate the introduction of contaminants, including atmospheric contaminants, into the arc chamber.

In another aspect, the Sb-containing source material is stored in a storage and delivery vessel having an impurity free environment containing no greater than trace amounts of moisture and other atmospheric impurities. In the presence of moisture, halogenated Sb-containing compounds can react to form $Sb_2O_3$, $H_2$, HF, or HCl. Such an impurity free environment not containing trace amounts of impurities can be achieved in the storage vessel by several techniques, one of which includes performing cycles of a so-called "freeze pump thaw". In one cycle of a freeze-pump-thaw, the Sb-containing source material is cooled such that all of the Sb-containing source material vapor condenses from the gas phase and the Sb-containing liquid freezes, while other contaminants such as moisture and nitrogen remain in the vapor phase. After allowing sufficient time for the Sb-containing source material to condense, the head space of the vessel is evacuated using a pump, while the vessel continues to be cooled such that substantially all of the vapor contaminants are removed and the Sb-containing material remains as a solid, liquid or mixture thereof in the vessel. When the contaminants have been removed, the vessel is enclosed and the Sb-containing material in the solid, liquid or mixture thereof is heated to ambient temperature to re-form a liquid and vapor that is in substantial equilibrium with the liquid. In this manner, moisture and other impurities, especially atmospheric impurities, are avoided from being introduced into the storage and delivery vessel. Alternatively or in addition thereto, other techniques may be used for achieving a moisture and gaseous free environment for the Sb-containing material, including but not limited to, fluorine passivation of the inner surfaces of the vessel.

In one embodiment, the resultant composition of the vapor phase includes impurities in the headspace that is no greater than 5 vol %. The various vapor phase impurities comprise 0 to 4 vol % N2; 0 to 0.5 vol % O2; 0 to 0.49 vol % HF; 0 to 0.01 vol % $H_2O$; with a balance of the vapor phase constituting the antimony-containing material. The high purity antimony-containing material can have a liquid phase comprising a total amount of liquid phase impurities no greater than 1 vol % impurities, wherein the liquid phase impurities comprises 0 to 0.1 vol % N2; 0 to 0.1 vol % O2; 0 to 0.6 vol % HF; 0 to 0.1 vol % $SbF_3$; 0 to 0.1 vol % $Sb_2O_3$ with the balance of the liquid phase constituting the antimony-containing material.

The deleterious effects of carbon-based deposits during Sb ion implantation are preferably avoided by the present invention. The Sb-containing source material is a molecule represented by a non-carbon containing chemical formula to reduce or eliminate formation of carbon-based deposits in the arc chamber and throughout other regions of the ion source. Examples of carbon-based deposits include but are not limited to C, CF, and CCl compounds. The carbon-based deposits can reduce the ion source life by forming whiskers or other various shaped deposits along various components of the ion implanter, including the extraction plate, where carbon-based deposition can cause the distortion of the shape of the ion beam. Alternatively, or in addition thereto, the carbon-based deposits can deposit and accumulate as residual particles onto the substrate. The presence of carbon in the plasma can also lower the beam current of Sb due to the formation of carbon-containing ions which become freely available for dilution of the plasma. Accordingly, the present invention preferably utilizes Sb-containing source materials represented by a non-carbon containing chemical formula. In this manner, the avoidance of carbon in the Sb-containing source material reduces or eliminates the introduction of carbon-derived deposits entering the arc chamber along with the associated deleterious effects.

In a preferred embodiment, antimony pentafluoride ($SbF_5$) is the Sb-containing source material for performing ion implantation. $SbF_5$ is a corrosive liquid that is a relatively strong lewis acid and can react violently with moisture to produce $Sb_2O_3$ and HF. As such, the SbF5 source material is stored in a storage and delivery vessel under sub-atmospheric conditions in an environment containing less than 5 vol % of moisture and other gaseous impurities. $SbF_5$ can be maintained as a liquid at about 25 Celsius with a vapor pressure of about 10 Torr in a storage and delivery vessel that is operably connected to an arc chamber.

Other source materials are contemplated. For example, in another embodiment of the present invention, $SbCl_5$ is an antimony-containing source material suitable for ion implantation. $SbCl_5$ is maintained as a liquid at about 30 Celsius with a vapor pressure of 1.7 Torr in a storage delivery vessel that is operably connected to an arc chamber. Other source materials in accordance with the applicable criteria of the present invention may also be used as described herein.

Notwithstanding the stability of $SbF_5$ and the process benefits of using a liquid based material for Sb ion implantation, the inventors have recognized that one of the design challenges of utilizing $SbF_5$ and other fluorine containing Sb compounds is that the presence of fluorine in the compound may lead to an excess of fluorine ions in the plasma. The fluorine ions can propagate a so-called "halogen cycle" in which halogen ions in excess can cause etching of tungsten chamber walls onto the cathode producing tungsten fluoride species, generally represented by WFx, which can migrate onto the hot ion source filament where it can deposit tungsten. The deposition of tungsten has a tendency to increase the operating voltage of the ion source which in turn increases the deposition of W onto the ion source filament, until the ion source may eventually degrade. This halogen cycle has a tendency to reduce the lifetime of the ion source.

To mitigate the effects of the halogen cycle, hydrogen containing compounds can be incorporated during use of either $SbF_5$ or other Sb-containing source materials contemplated by the present invention, particularly those containing fluorine atoms or other halogens. The hydrogen containing compounds can be introduced into the arc chamber in any possible manner, including by sequentially flowing or co-flowing the hydrogen containing compounds with the $SbF_5$ or with the other Sb-containing source materials of the present invention. Alternatively, the hydrogen containing compounds can be stored as a mixture with the $SbF_5$ or the other Sb-containing source materials contemplated by the present invention. Suitable hydrogen containing compounds include, but are not limited to, $H_2$, $CH_3F$, $CH_2F_2$, $Si_2H_6$, $PH_3$, $AsH_3$, $SiH_4$, $GeH_4$, $B_2H_6$, $CH_4$, $NH_3$, or $H_2S$ and any combination thereof.

The amount of hydrogen-containing compound introduced into the arc chamber to mitigate the halogen cycle should be in an effective amount that is capable of neutralizing or scavenging the deleterious effects of fluorine or other halogens that may be contained in the Sb-containing source materials of the present invention. When $SbF_5$ is utilized, the effective amount of hydrogen-containing compound is preferably at least about 20 vol % of the overall composition of $SbF_5$ and the hydrogen-containing compound to provide an adequate amount of hydrogen atoms to mitigate the deleterious effects of the halogen cycle. The term "effective amount" as used herein and throughout means the required amount of a particular material, such as hydrogen-containing compounds, to achieve the stated goal, such as neutralizing or scavenging the deleterious effects of fluorine or other halogen ions that may be present as a result of the halogen cycle, or otherwise, during a specific recipe for ion implantation of Sb ionic species. In one example, the vol % of the hydrogen-containing compound needed to mitigate the halogen cycle can be approximately 50 vol % of the resultant compositional mixture of the $SbF_5$ and the hydrogen-containing compound formed in the arc chamber. It should be understood that the effective amount of the hydrogen containing compound can be greater than about 50 vol % of the total composition of $SbF_5$ and the hydrogen-containing compound.

The avoidance of solid Sb-containing sources in the present invention by using the contemplated liquid source materials of the present invention that meet the applicable criteria as defined herein includes several process benefits. For example, excessive heating, as typically required to adequately volatize solid Sb-containing sources and prevent its condensation and deposition along conduit and flows lines of the ion implant system is reduced or entirely avoided when employing the Sb-containing source materials of the present invention. At minimum, conventional Sb-containing solid sources require that the conduit extending between the storage and delivery vessel and the arc chamber be heated to prevent condensation of Sb-containing solid sources which are vaporized but may be susceptible to condensation during the ion implantation. On the contrary, the present invention reduces the amount of or eliminates the need to heat trace the conduit. The present invention also reduces or eliminates the risk of the inventive Sb-containing material from depositing and accumulating onto the chamber walls and/or the ion source filament. The avoidance of such excessive temperatures also reduces or eliminates tendencies for decomposition and side reactions that can make the Sb ion implant process difficult to control.

Still further, the present invention eliminates the need for a carrier or reactive gas. On the contrary, carrier or reactive gases have been previously implemented when, by way of example, a solid Sb-containing source is plated onto a surface in close proximity to the arc chamber thereby requiring heating of the surface to elevated temperatures to vaporize the solid Sb-containing source. The carrier or reactive gas then directs the vaporized Sb-containing source into the arc chamber. The elimination of a carrier gas by the present invention is possible as a result of the ability to generate a steady, sufficient and sustained flow of the antimony-containing vapor. Additionally, the elimination of the carrier gas enables delivery of the antimony-containing vapor at high purity. Conventional processes which require carrier gas for antimony flow cannot deliver the high purities of the present invention.

With reference to FIG. 1, an exemplary beam line ion implantation apparatus in accordance with the principles of the invention is shown. Beam line ion-implant systems are used to perform ion implant processes. The components of a beam line ion plant system are shown in FIG. 1. A Sb-containing liquid source material 101 is selected in accordance with the principles of the present invention so as to have adequate vapor pressure. The Sb-containing source material 101 is stored in a storage and delivery vessel located within a gas box 100 as shown in FIG. 1. The Sb-containing liquid source material 101 is stored in an environment with only trace amounts of impurities. The Sb-containing liquid source material 101 is further represented by a non-carbon containing formula. In a preferred embodiment, the Sb-containing liquid source material 101 is SbF5. Alternatively, the Sb-containing liquid source material 101 is SbCl5. One or more hydrogen-containing compounds may be optionally included in a gas box 100 and flowed into the arc chamber 103 in an effective amount to mitigate the effects of the halogen cycle when a Sb-containing material including a halogen (e.g., SbF5 or SbCl5) is utilized.

The Sb-containing liquid source material 101 is stored in a liquid phase that is in substantial equilibrium with a corresponding vapor phase occupying the head space of the storage and delivery vessel. The vapor pressure of the Sb-containing source material 101 is sufficient to reduce or eliminate the amount of heating of the lines between the gas box 100 and the ion source chamber 103, thereby enabling control stability of the process as described hereinbefore. The vapor phase of the Sb-containing liquid material 101 is configured to flow at a substantially continuous and adequate flow rate in the vapor phase in response to a vacuum pressure condition downstream of the gas box 100. The vapor exits headspace of the storage and delivery vessel and flows into conduit and then flows therealong towards the ion source chamber 103. The vapor pressure of the Sb-containing source material within the storage and delivery vessel in gas box 100 is sufficient to allow stable flow of the vapor phase of the Sb-containing source material along conduit and into the arc chamber 103. The vapor phase of the Sb-containing liquid material 101 is introduced into an ion source chamber 103 where the ionization of the material 101 occurs. Energy is introduced into the chamber 103 to ionize the Sb-containing vapor. Flow control device 102, which can include one or more mass flow controllers and corresponding valves, is used to control the flow rate of the vapor at a predetermined value. The excessive temperatures, as is typically required with conventional solid-containing Sb sources, are avoided with the process of FIG. 1 to control vapor flow at the desired flow rates mentioned herein to allow stable and controlled operation of the ion implanter. The ionization of the Sb-containing material may create various antimony ions. An ion beam extraction system 104 is used to extract the antimony ions from the ion source chamber 103 in the form of an ion beam of desired energy. Extraction can be carried out by applying a high voltage across extraction electrodes. The beam is transported through a mass analyzer/filter 105 to select the Sb ionic species to be implanted. The ion beam can then be accelerated/decelerated 106 and transported to the surface of the target workpiece 108 (i.e., substrate) positioned in an end station 107 for implantation of the Sb ions into the workpiece 108. The workpiece may be, for example, a semiconductor wafer or similar target object requiring ion implantation. The Sb ions of the beam collide with and penetrate into the surface of the workpiece at a specific depth to form a doped region with the desired electrical and physical properties.

Figure 2:
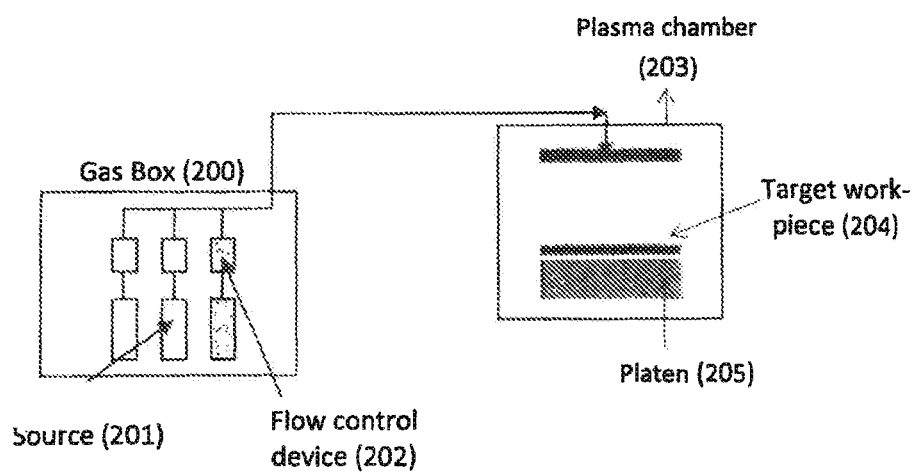
FIG. 2 shows a plasma immersion ion implant system, incorporating the principles of the present invention.

It should be understood that the novel Sb-containing material of the present invention can be utilized with other ion implant systems. For example, a Plasma immersion ion implant (PIII) system as shown in FIG. 2 may also be utilized to implant Sb ions. Such a system includes a gas box 200, which is similar in configuration to the beam line ion implantation apparatus 100. Operation of the PIII system is similar to that of the beam line ion implant system of FIG. 1. Referring to FIG. 2, the vapor phase of the Sb-containing liquid source material of the present invention is introduced from the source 201 into the plasma chamber 203 by a flow control device 202. Source 201 represents a storage and delivery vessel that is configured to store a liquid phase of Sb-containing material in substantial equilibrium with a corresponding vapor phase occupying a headspace of the storage and delivery vessel. Sb-containing liquid source material 201 is stored in an environment with only trace amounts of impurities. The Sb-containing liquid source material 101 is further represented by a non-carbon containing formula. In a preferred embodiment, the Sb-containing source material 101 is SbF5. Alternatively, the Sb-containing source material 101 is SbCl5.

The vapor pressure of the Sb-containing source material 201 is sufficient to reduce or eliminate the amount of heating of the lines between the gas box 200 and the plasma chamber 203, thereby enabling control stability of the process as described hereinbefore. The vapor phase of the Sb-containing liquid source material 201 is configured to flow at a substantially continuous and adequate flow rate in the vapor phase in response to a vacuum pressure condition downstream of the gas box 200. The vapor phase exits headspace of the storage and delivery vessel and flows into conduit and then flows therealong towards the plasma chamber 203. The vapor pressure of the Sb-containing source material within the storage and delivery vessel in gas box 200 is sufficient to allow stable flow of the vapor phase of the Sb-containing source material along conduit and into the arc chamber 203.

As the vapor phase of the Sb-containing liquid material is introduced into an ion source chamber 203, energy is subsequently provided to ionize the Sb-containing vapor and produce Sb ions. The Sb ions present in the plasma are accelerated towards the target work piece 204. It should be understood that one or more hydrogen-containing compounds may be optionally included in gas box 200 and flowed into the plasma chamber 203 in an effective amount to mitigate the effects of the halogen cycle when a Sb-containing material including a halogen (e.g., SbF5 or SbCl5) is utilized.

Figure 3:
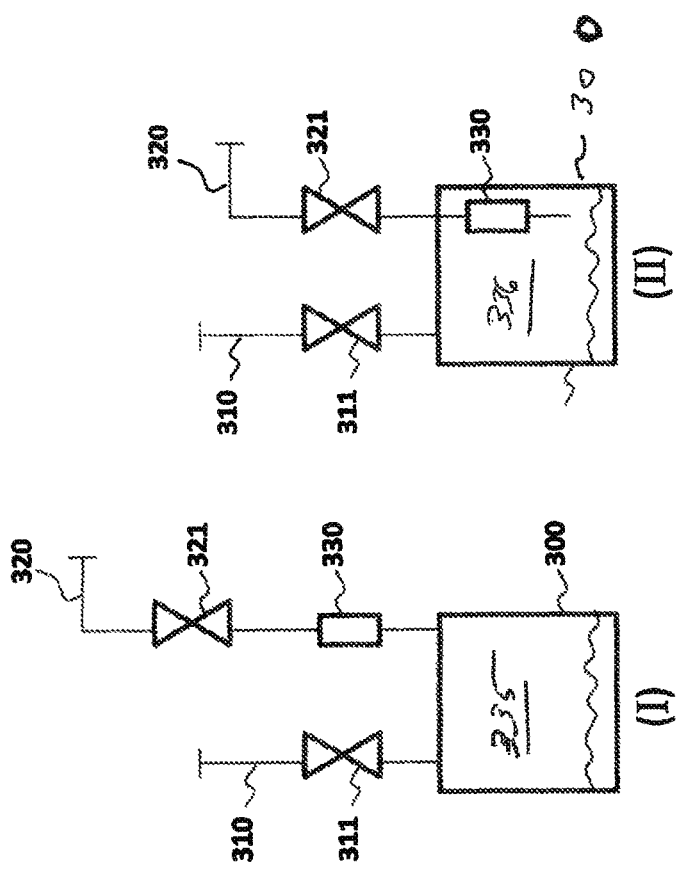
FIG. 3 shows an exemplary storage and delivery vessel, incorporating the principles of the present invention.

In another aspect of the present invention, a storage and delivery vessel for the Sb-containing source material disclosed herein is provided as shown in FIG. 3. The storage and delivery vessel allows for safe packaging and delivery of the inventive Sb-containing source material. The Sb-containing source material of the present invention is contained within vessel 300. The vessel 300 is equipped with an inlet port 310 to allow filling of vessel 300 with the desired Sb-containing source material. The port can also be used to purge the interior of vessel 300 with inert gas and evacuate vessel 300 before filling with the desired Sb dopant material. In one example, cycles of freeze pump thaw can be conducted utilizing vessel 300 to create an environment with less than 5 vol % impurities in the head space, based on a total volume of the headspace. The storage and delivery vessel 300 (case I) contains a headspace 335 of a predetermined volume, and the storage and delivery vessel 300 (case II) contains a headspace 336 of a predetermined volume, where the vessels 300 (cases I and II) are configured and prepared in accordance with the principles of the present invention.

An outlet port 320 is provided to withdraw a vapor phase of the Sb-containing material from the headspace of vessel 300. A vacuum actuated check valve 330 is provided upstream of outlet port that dispenses a controlled flow rate of the Sb-containing material in response to sub-atmospheric conditions occurring downstream of the cylinder 300. This vacuum actuated check valve 330 enhances the safety while handling the various Sb-containing materials of the present invention. When valve 321 is open to atmospheric pressure, check valve 330 prevents introduction of any air or other contaminants inside vessel 300, and hence mitigates both the risk of contamination and the reduction of the partial pressure of Sb-containing material in the vapor phase occupying the head space of vessel 300. In this manner, high purity levels of the Sb-containing materials can be maintained during storage, delivery and use thereof in a safe manner whereby the withdrawn vapor phase of the Sb-containing source material can maintain adequate vapor pressure to create the required flow rate during ion implantation. The check valve 330 can be situated outside vessel 300 (Case I). Alternatively, the check valve 330 can be situated inside vessel 300 (Case II). The vessel 300 is in fluid communication with a discharge flow path, wherein the check valve 330 is actuated to allow a controlled flow of the Sb-containing source material from the interior volume of the vessel 300 in response to a sub-atmospheric condition achieved along the discharge flow path.

The storage and delivery vessel 300 may be a cylinder for holding the Sb-containing material in at least partial vapor phase under sub-atmospheric conditions. The Sb-containing material is stored at sub-atmospheric conditions therewithin. The Sb-containing material remains chemically stable and does not undergo decomposition within the interior of the cylinder 300. The Sb-containing material is preferably stored as a liquid at ambient temperature (10-35° C.). In one embodiment, the vapor pressure is greater than about 1 Torr. In another embodiment, the vapor pressure is greater than about 3 Torr, and more preferably greater than about 5 Torr.

Figure 4:
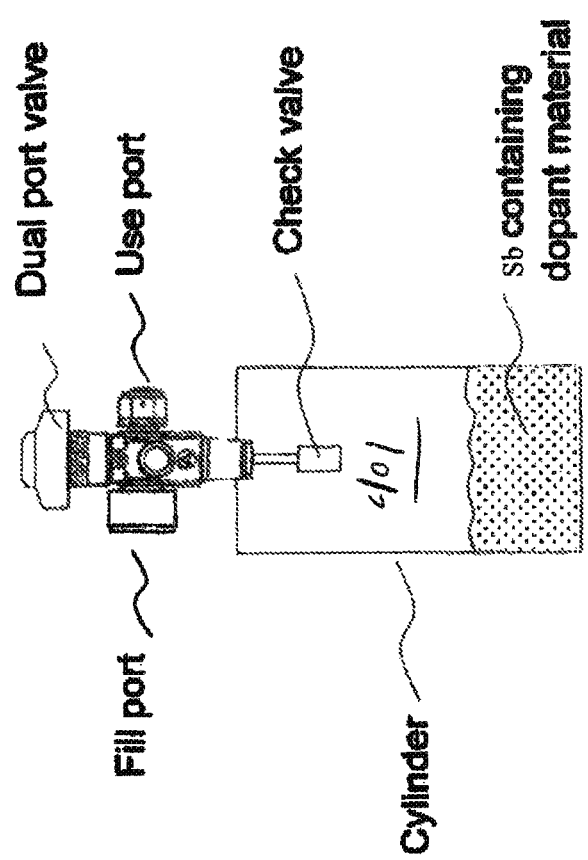
FIG. 4 shows an alternative storage and delivery vessel incorporating the principles of the present invention.

The cylinder 300 preferably includes a dual port valve assembly in mechanical communication with the cylinder 300. The dual port valve is shown in FIG. 4 and comprises a fill port valve and a discharge port valve, wherein the fill port valve is in fluid communication with an interior of the cylinder to introduce the Sb-containing dopant material therein. The discharge port valve is in fluid communication with a flow discharge path extending from the interior to the exterior of the cylinder to discharge the antimony-containing dopant material therefrom. The check valve 330 is located along the flow discharge path, whereby the check valve is configured to move from a closed position to an open position in response to a sub-atmospheric condition external to the cylinder. Headspace 401 has a predetermined volume in accordance with the principles of the present invention.

Other storage vessels are contemplated. For example, in an alternative embodiment, the antimony-containing dopant material may be stored and dispensed from an adsorbent-based delivery system. Various suitable adsorbents are contemplated, including but not limited to a carbon-based absorbent or a metal-organic framework.

Several modifications to the cylinders of FIGS. 3 and 4 are contemplated without departing from the scope of the present invention. For example, it should be understood that the dual port valve of FIG. 3 and FIG. 4 can be utilized without the use of a check valve. Furthermore, it should be understood that the principles of the present invention can be utilized with a storage and delivery vessel having a single port for filling and dispensing without the use of a check valve.

In yet another embodiment, the UpTime® delivery device, commercially available by Praxair (Danbury, Conn.) and as disclosed in U.S. Pat. Nos. 5,937,895; 6,045,115; 6,007,609; 7,708,028; and 7,905,247 and U.S. Patent Publication No. 2016/0258537 all of which are incorporated herein by reference in their entirety, may be employed in the present invention to safely deliver a controlled flow rate of the vapor phase of the Sb-containing source material from vessel 300 to an ion apparatus for Sb ion implantation. The vacuum-actuated check valve of the UpTime® delivery device serves to prevent contamination of air and other gases at atmospheric pressure which may be present in the surrounding environment from infiltrating into the vessel and contaminating the Sb-containing precursor material and reducing its partial pressure.

Other suitable sub-atmospheric delivery devices may include pressure regulators, check valves, excess flow valves and restrictive flow orifices in various arrangements. For example, two pressure regulators may be disposed in series within the cylinder to down regulate the cylinder pressure of the Sb-containing source material in the vapor phase within the vessel to a predetermined pressure acceptable for downstream mass flow controllers contained along the fluid discharge line.

The vessel or cylinder 300 along with the contemplated variations thereof may be configured in combination with a beamline ion implant system (FIG. 1), whereby the vessel or cylinder 300 is operably connected to said system by a network of flow lines or conduit extending there between. Advantageously, the conduit is preferably characterized by elimination or a reduced amount of heat tracing in comparison to conventional Sb-containing sources.

Alternatively, the vessel or cylinder 300 along with the contemplated variations thereof may be configured in combination with a plasma immersion system (FIG. 2), whereby the vessel or cylinder 300 is operably connected to said plasma immersion system by a network of flow lines or conduit extending there between. Advantageously, the conduit is preferably characterized by elimination or a reduced amount of heat tracing in comparison to conventional Sb-containing sources.

Numerous benefits of the present invention are contemplated. For example, the utilization of liquid-based Sb-containing precursors of the present invention for delivery of the Sb-containing vapor phase for Sb ion implantation, followed by switching to a different gaseous dopant source generally requires less time as compared to utilizing solid-based Sb-containing precursors for Sb ion implantation and then utilizing a different gaseous dopant source. Specifically, compared to solid Sb-containing sources, the utilization of liquid-based Sb-containing precursors of the present invention for delivery of the Sb-containing vapor phase reduces the start-up time required to switch to different dopant species for ion implantation, thereby resulting in a greater wafer throughput for the implanter. As an example, an implanter running solid Arsenic (As) or solid Phosphorus (P) as a source material for implantation of their respective ionic species can be expected to require about 30 minutes to tune the ion beam while the use of gaseous $AsH_3$ or gaseous $PH_3$ source materials generally can be expected to require only about 4 minutes to tune its ion beam. The term "tuning" or "tune" as used herein and throughout means the process of producing a beam of only the target ion species with a specific beam current and size. In comparison, with regards to solid Sb-containing source materials, mass flow into the arc chamber is controlled by the vaporizer temperature required for sublimation in which the Sb-containing source is stored to ensure the solid source is sufficiently heated into a vapor phase prior to delivery to the arc chamber. When taking into consideration the time to heat the solid Sb-containing source material to its vapor phase, tune the beam and subsequently cool down the solid Sb-containing source upon completion of the ion implantation process, a total time of about 30-90 minutes to switch to another dopant species can occur, whereas delivery of a gaseous dopant source derived from the Sb-containing liquid precursors can require a duration of about 5-10 minutes. The net result can be significant increase in throughput with the present invention.

Additionally, the liquid-based Sb-containing precursors of the present invention can be placed in the same gas box (e.g., as shown in FIGS. 1 and 2) as other dopant sources without requiring additional heating. In contrast, Sb-containing solid sources require a separate vaporizer positioned along the conduit that is extending to the arc chamber for purposes of ensuring the Sb-containing vapor does not re-condense, which necessitates more space than may be available, and, further, which adds complexity and expense to the ion implantation process.

EXPERIMENTAL DESCRIPTION

A flow test system was constructed to test the flow capabilities of antimony pentafluoride, $SbF_5$, which exists as a liquid at room temperature with a vapor pressure of 10 Torr at 25 Celsius. For each of the experiments, the flow system consisted of a manifold with a pressure transducer connected to the manifold to read the pressure exerted by the SbF5 vapor in the headspace of the cylinder, a mass flow controller in the manifold to measure and control the flow of vapor, and a roughing vacuum pump to maintain vacuum pressure of less than 1e-2 Torr downstream of the mass flow controller. The cylinder used in each experiment was made of carbon steel and equipped with a dual port valve that consisted of a fill port and a use port. The cylinder was connected to the manifold.

Generally speaking, preparation of each cylinder filled with liquid SbF5 to be flow tested occurred as follows. Each cylinder was filled with liquid $SbF_5$ in an atmosphere of $N_2$ to ensure the liquid SbF5 would not react with water vapor in the atmosphere. The purity level of liquid SbF5 was 99 vol %. To remove the $N_2$, water vapor and any other gaseous impurities from the head space of the cylinder down to trace amounts, two cycles of freeze pump thaw, as previously described herein, were performed on each cylinder. In one cycle of freeze pump thaw, the cylinder was placed in an ice bath for over 20 minutes to condense the $SbF_5$ vapor from the vapor phase into a liquid, and freeze the $SbF_5$ liquid, while the $N_2$, water vapor and any other gaseous impurities remained in the vapor phase within the headspace of the cylinder. The cylinder was then opened and evacuated with a vacuum pump for greater than 1 minute to remove the N2, water vapor and any other gaseous impurities from the headspace to trace amounts. Subsequently, the cylinder was closed and isolated from the pump. After isolating the cylinder, the ice bath was removed to allow the cylinder to be warmed to ambient temperature, thereby allowing re-formation of the liquid SbF5 and the corresponding vapor SbF5.

Before the start of each experiment, the cylinder valve was opened to allow SbF5 vapor to exit from the headspace through the use port and enter and fill the section of the manifold up to the mass flow controller. By having the SbF5 vapor occupy the manifold the pressure transducer was able to read the pressure there within, which represented the vapor pressure of SbF5 in the cylinder.

Next, flow tests were carried out to determine whether a steady, sustained and sufficient flow of SbF5 vapor from the cylinder could be achieved, with the key details of each test and corresponding results as described below.

Comparative Example 1

A 420 mL carbon steel cylinder was filled with 300 g (i.e., 100 mL) of liquid $SbF_5$. The volume of head space in the cylinder was 320 mL. The cylinder and flow manifold were maintained at an ambient temperature of 25 Celsius, which resulted in a SbF5 vapor pressure of 10 Torr as read by the pressure transducer. No external heating was utilized. No carrier gas was utilized. The cylinder was tested for its sustained flow characteristic. The cylinder was not able to maintain a sustained flow of greater than 0.3 sccm of $SbF_5$.

Comparative Example 2

A 2.2 L carbon steel cylinder was filled with 1 kg or 335 mL (i.e., liquid $SbF_5$). The volume of head space in the cylinder was 1.865 L. The cylinder and valve were heated to 40 Celsius to increase the vapor pressure, which resulted in a SbF5 vapor pressure of 15 Torr as read by the pressure transducer. No carrier gas was utilized. The manifold and mass flow controller were not heated and remained at an ambient temperature of 22 Celsius. The cylinder was tested for its sustained flow characteristic. The cylinder was not able to maintain a sustained flow of greater than 0.3 sccm of $SbF_5$ as a result of the formation of blockage in the flow line due to condensation of SbF5 vapor.

Example 1

A 2.2 L carbon steel cylinder was filled with 1 kg (i.e., 335 mL) of liquid $SbF_5$. The volume of head space in the cylinder was 1.865 L. The cylinder and flow manifold were maintained at an ambient temperature of 25 Celsius, which resulted in a SbF5 vapor pressure of 10 Torr as read by the pressure transducer. No external heating was utilized. No carrier gas was utilized. The cylinder was tested for its sustained flow characteristic. The cylinder was able to maintain a sustained flow of 2 sccm of $SbF_5$.

Example 2

A 2.2 L carbon steel cylinder was filled with 1 kg (i.e., 335 mL) of liquid $SbF_5$. The volume of head space in the cylinder was 1.865 L. The cylinder and flow manifold were maintained at an ambient temperature of 22 Celsius, which resulted in a SbF5 vapor pressure of 7 Torr as read by the pressure transducer. No external heating was utilized. No carrier gas was utilized. The cylinder was tested for its sustained flow characteristic. The cylinder was able to maintain a sustained flow of 2 sccm of $SbF_5$.

Example 3

A 2.2 L carbon steel cylinder was filled with 335 g (i.e., 112 mL) of liquid $SbF_5$. The volume of head space in the cylinder was 2.088 L. The cylinder and flow manifold were maintained at an ambient temperature of 22 Celsius, which resulted in a SbF5 vapor pressure of 7 Torr as read by the pressure transducer. No external heating was utilized. No carrier gas was utilized. The cylinder was tested for its sustained flow characteristic. The cylinder was able to maintain a sustained flow of 2 sccm of $SbF_5$.

Example 4

A 2.2 L carbon steel cylinder was filled with 335 g (i.e., 112 mL) of liquid $SbF_5$. The volume of head space in the cylinder was 2.088 L. The cylinder and flow manifold were maintained at an ambient temperature of 25 Celsius which resulted in a SbF5 vapor pressure of 10 Torr as read by the pressure transducer. No external heating was utilized. No carrier gas was utilized. The cylinder was tested for its sustained flow characteristic. The cylinder was able to maintain a sustained flow of 2 sccm of $SbF_5$.

Example 5

A 2.2 L carbon steel cylinder was filled with 1 kg (i.e., 335 mL) of liquid $SbF_5$. The volume of head space in the cylinder was 2.088 L. The cylinder and flow manifold were maintained at an ambient temperature of 18 Celsius which resulted in a SbF5 vapor pressure of 5 Torr as read by the pressure transducer. No external heating was utilized. No carrier gas was utilized. The cylinder was tested for its sustained flow characteristic. The cylinder was able to maintain a sustained flow of 2.5 sccm of $SbF_5$.

As can be seen, the present invention in one aspect provides a viable solution for Sb-containing sources for ion implantation, including Sb-containing solid sources which are difficult to deliver consistently into arc chambers due to their low vapor pressure and limited thermal stability.

It should be understood that the principles of the present invention can be applied to other processes besides ion implantation having a need for a sufficient, sustained and steady flow of antimony-containing material in the vapor phase.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A sub-atmospheric storage and delivery vessel configured for delivering a high purity, vapor phase of antimony-containing material, comprising:
a storage and delivery vessel, said storage and delivery vessel configured for holding said antimony-containing material in a liquid phase under sub-atmospheric conditions, whereby said liquid phase is in substantial equilibrium with the high purity, vapor phase of the antimony-containing material, and said high purity, vapor phase of the antimony-containing material exerting a vapor pressure less than atmospheric pressure, said high purity, vapor phase equal to about 95 vol % or greater based on a total volume of the vapor phase;
said storage and delivery vessel comprising multiple walls having sufficient surface area contact with the liquid phase, and further wherein said multiple walls exhibit a thermally conductivity to enhance heat conduction into the liquid;
said storage and delivery vessel characterized by an absence of external heating and an absence of a carrier gas during dispensing of the high purity, vapor phase antimony-containing material.

2. The sub-atmospheric storage and delivery vessel of claim 1, wherein the antimony-containing material is represented by a non-carbon containing chemical formula to reduce or eliminate formation of carbon-based deposits in an arc chamber of the ion implanter and throughout other regions of the ion source.

3. The sub-atmospheric storage and delivery vessel of claim 1, the thermal conductivity of the multiple walls ranges from 1 to 425 W/m-K, and the antimony-containing material is represented by a non-carbon containing chemical formula to reduce or eliminate formation of carbon-based deposits in the arc chamber and throughout other regions of the ion source.

4. The sub-atmospheric storage and delivery vessel of claim 1, wherein said liquid phase comprise a total amount of liquid phase impurities ranging from 0 to 1 vol % impurities, and further wherein said liquid phase impurities comprises 0 to 0.1 vol % N2, 0 to 0.1 vol % O2, 0 to 0.6 vol % HF, 0 to 0.1 vol % SbF3, 0 to 0.1 vol % Sb2O3 and the balance being the antimony-containing material in the liquid phase.

5. A sub-atmospheric storage and delivery vessel configured for delivering a high purity, vapor phase of antimony-containing material, comprising:
a storage and delivery vessel, said storage and delivery vessel configured for holding said antimony-containing material in a liquid phase under sub-atmospheric conditions, whereby said liquid phase is in substantial equilibrium with the high purity, vapor phase of the antimony-containing material occupying a predetermined volume of headspace in the storage and delivery vessel, and said high purity, vapor phase of the antimony-containing material exerting a vapor pressure less than atmospheric pressure, said high purity, vapor phase equal to about 95 vol % or greater based on the predetermined volume of the headspace;

said predetermined volume of the headspace being sized so as to receive a sufficient amount of the high purity, vapor phase of the antimony-containing material;

said storage and delivery vessel characterized by an absence of external heating and an absence of a carrier gas during dispensing of the high purity, vapor phase antimony-containing material.

6. The sub-atmospheric storage and delivery vessel of claim 5, wherein a surface area of the liquid phase that is exposed to the high purity, vapor phase is at least about 50 cm2 and further wherein the predetermined volume of the headspace is 1 Liter or greater.

7. The sub-atmospheric storage and delivery vessel of claim 5, further comprising an adsorbent.

8. The sub-atmospheric storage and delivery vessel of claim 5, wherein a pressure in the headspace is greater than or equal to 1 Torr.

9. A high purity antimony containing material in a storage vessel comprising a liquid phase and a vapor phase, said vapor phase comprising a total amount of vapor phase impurities ranging from 0 to 5 vol % impurities wherein the vapor phase impurities comprises 0 to 4 vol % N2, 0 to 0.5 vol % O2, 0 to 0.49 vol % HF; 0 to 0.01 vol % H2O; and the balance being the antimony-containing material in the vapor phase.

10. A high purity antimony-containing material in a storage vessel comprising a liquid phase and a vapor phase, said liquid phase comprising a total amount of liquid phase impurities ranging from 0 to 1 vol % impurities, wherein the liquid phase impurities comprises 0 to 0.1 vol % N2, 0 to 0.1 vol % O2, 0 to 0.6 vol % HF, 0 to 0.1 vol % SbF3, 0 to 0.1 vol % Sb2O3 and the balance being the antimony-containing material in the liquid phase.

11. A method of preparing a sub-atmospheric storage and delivery vessel configured for delivery of a steady, sustained and sufficient flow of a high purity, vapor phase of antimony source material, comprising the steps of:
providing a container with multiple walls having a thermal conductivity of 5 W/m*K;
performing a fluorine passivation to the multiple walls, followed by;
introducing an antimony-containing material in a liquid phase into the container in a presence of an inert gas;
creating a predetermined headspace volume of greater than or equal to about 1 L, said predetermined headspace volume having trace amounts of impurities;
evaporating a sufficient amount of the antimony containing material into the vapor phase in the predetermined headspace volume, wherein said step of evaporating is performed with an absence of external heating;
freezing the liquid phase of the antimony containing material to form frozen antimony containing material;
condensing the vapor phase of the antimony containing material from the predetermined headspace volume to form a condensed high purity, vapor phase;
evacuating nitrogen, water vapor, the inert gas and any other gaseous impurities from the predetermined headspace volume;
allowing the condensed vapor phase to increase in temperature so as to form the high purity, vapor phase within the predetermined headspace volume; and
allowing the frozen antimony containing material to increase in temperature to re-form the liquid phase.

12. The method of claim 11, further comprising performing each of the steps of (i) condensing, (ii) evacuating, and (iii) allowing the condensed high purity, vapor phase and the frozen antimony containing material to warm so as to re-form the liquid phase and to reform the high purity, vapor phase within the predetermined headspace volume, wherein each of the steps (i), (ii) and (iii) is performed two or more times to achieve vapor phase impurities in the headspace comprising 0 to 4 vol % N2, 0 to 0.5 vol % O2, 0 to 0.49 vol % HF and 0 to 0.01 vol % H2O wherein a total amount of the vapor phase impurities is 5 vol % or lower.

13. A method of using a sub-atmospheric storage and delivery vessel filled with high purity antimony-containing material, comprising:
operably connecting the vessel to a downstream ion implant tool;
establishing a pressure downstream of the sub-atmospheric storage and delivery vessel that is less than the vapor pressure of a high purity, vapor phase of the antimony-containing material occupying a predetermined headspace volume of the vessel;
actuating a valve into the open position;
dispensing the antimony-containing material from the predetermined headspace volume of the vessel in an absence of heating, said antimony-containing material dispensed as a high purity, vapor phase at a flowrate of 0.1 sccm or greater in an absence of a carrier gas; and
flowing the high purity, vapor phase of the antimony-containing material in an absence of the carrier gas at the flowrate of 0.1 sccm or greater towards the ion implant tool; and
evaporating additional antimony-containing material from a corresponding liquid phase in the vessel in the absence of heating to continue supplying the high purity, vapor phase of the antimony-containing material from the headspace at the flowrate of 0.1 sccm or greater.

* * * * *